(12) United States Patent
Shiozawa et al.

(10) Patent No.: US 9,558,960 B2
(45) Date of Patent: Jan. 31, 2017

(54) SUBSTRATE PROCESSING METHOD, NON-TRANSITORY STORAGE MEDIUM AND HEATING APPARATUS

(71) Applicant: Tokyo Electron Limited, Tokyo (JP)

(72) Inventors: Takahiro Shiozawa, Koshi (JP); Kenichi Ueda, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 14/757,850

(22) Filed: Dec. 24, 2015

(65) Prior Publication Data

US 2016/0189974 A1 Jun. 30, 2016

(30) Foreign Application Priority Data

Dec. 26, 2014 (JP) .................. 2014-265051

(51) Int. Cl.
| | | |
|---|---|---|
| *H01L 21/3105* | (2006.01) | |
| *H01L 21/027* | (2006.01) | |
| *H01L 21/67* | (2006.01) | |
| *H05B 3/00* | (2006.01) | |
| *B05D 3/02* | (2006.01) | |

(Continued)

(52) U.S. Cl.
CPC ....... *H01L 21/31058* (2013.01); *B05D 3/0254* (2013.01); *B05D 3/0281* (2013.01); *H01L 21/0273* (2013.01); *H01L 21/02126* (2013.01); *H01L 21/02282* (2013.01); *H01L 21/3105* (2013.01); *H01L 21/31053* (2013.01); *H01L 21/6715* (2013.01); *H01L 21/67109* (2013.01);

(Continued)

(58) Field of Classification Search
CPC .......... H01L 21/31058; H01L 21/0273; H01L 21/3105; H01L 21/31053; H01L 21/31051; H01L 21/02351; H01L 21/02359; H01L 21/02362; H01L 21/02126; H01L 21/02282; H01L 21/312; H01L 21/02354; B05D 3/0254; B05D 3/0263; B05D 3/0272; B05D 3/0281; B05D 3/029
See application file for complete search history.

(56) References Cited

U.S. PATENT DOCUMENTS 5,569,618 A * 10/1996 Matsubara ........ H01L 21/02126
257/E21.244
2002/0063334 A1 * 5/2002 Shin .................. H01L 21/02126
257/758

(Continued)

FOREIGN PATENT DOCUMENTS

JP 2014-165252 A1 9/2014

*Primary Examiner* — Michael Trinh
(74) *Attorney, Agent, or Firm* — Burr & Brown, PLLC

(57) ABSTRACT

A substrate processing method includes a coating step that applies a coating liquid to a substrate having a front surface on which a pattern is formed, thereby forming a coating film on the substrate, a film removing step that heats the substrate to gasify components of the coating film thereby to reduce a thickness of the film, and a film curing step that is performed after or simultaneously with the film removing step and that heats the substrate to cure the coating film through crosslinking reaction. The film removing step is performed under conditions ensuring that an average thickness of the cured coating film is not greater than 80% of an average thickness of the coating film before being subjected to the film removing step.

6 Claims, 13 Drawing Sheets

(51) Int. Cl.
*H01L 21/02* (2006.01)
*H01L 21/687* (2006.01)

(52) U.S. Cl.
CPC ..... *H01L 21/67115* (2013.01); *H01L 21/6875* (2013.01); *H05B 3/0047* (2013.01)

(56) References Cited

U.S. PATENT DOCUMENTS

| | | | | |
|---|---|---|---|---|
| 2004/0161543 | A1* | 8/2004 | Nojo | B05D 3/0254 427/385.5 |
| 2007/0127916 | A1* | 6/2007 | Kitano | G03F 7/70991 396/611 |
| 2015/0357188 | A1* | 12/2015 | Shimura | H01L 21/31055 438/5 |

* cited by examiner

SUBSTRATE PROCESSING METHOD, NON-TRANSITORY STORAGE MEDIUM AND HEATING APPARATUS

CROSS REFERENCE TO RELATED APPLICATION

This application is based upon and claims the benefit of priority from the prior Japanese Patent Application No. 2014-265051 filed on Dec. 26, 2014, the entire contents of which are incorporated herein by reference.

TECHNICAL FIELD

The present invention relates to a substrate processing method including a step of forming an organic film onto a surface of a substrate having a pattern thereon, and also relates to a non-transitory storage medium storing computer program and a heating apparatus for executing the substrate processing method.

BACKGROUND ART

In manufacturing of a semiconductor device having a multi-layered wiring structure, a resist pattern is formed on a surface of a semiconductor wafer (hereinafter referred to simply as "wafer") by sequentially executing a resist coating step that applies a resist liquid onto the surface of the wafer to form a resist film; an exposure step that exposes the resist film with a predetermined pattern; and a developing step that develops the exposed resist film. Thereafter, a wafer etching step is performed using the resist film as a mask and then a resist film removing step is performed, so that a predetermined pattern is formed on the surface of the wafer. In order to produce the semiconductor device having the multi-layered wiring structure, the aforementioned process for forming a predetermined pattern in each layer is performed multiple times repeatedly.

In a case where patterns are formed in respective layers, namely, in a case where a (N+1)th layer is formed on a Nth layer having been patterned, a resist film for forming a pattern in the (N+1)th layer should have a suitable height level and thus the surface on which the resist liquid is to be applied must be flat. In order to achieve such a condition, an organic material is applied to a patterned layer to form an organic film such as one called SOC (Spin On Carbon). After the surface of the organic film is flattened, a resist liquid is applied onto the flattened organic film. It has been proposed a method of flattening of the organic film by etching back or removing the surface part of the organic film by using active oxygen and ozone which are generated by irradiating the organic film with ultraviolet ray. Japanese Patent Laid-open Publication No. JP2014-165252A discloses an apparatus for irradiating ultraviolet ray for the above purpose. Such an apparatus may be large-sized or complicated.

SUMMARY OF THE INVENTION

The object of the present invention is to provide a technique that is capable of forming a coating film on a patterned surface of a substrate and capable of increasing the flatness of the surface of the coating film with high in-plane uniformity, using an apparatus having a simple structure.

In one embodiment of the present invention, there is provided a substrate processing method, which includes: a coating step that applies a coating liquid to a substrate having a front surface on which a pattern is formed, thereby forming a coating film on the substrate; a film removing step that heats the substrate to gasify components of the coating film thereby to reduce a thickness of the film; and a film curing step that is performed after or simultaneously with the film removing step and that heats the substrate to cure the coating film through crosslinking reaction, wherein the film removing step is performed under conditions ensuring that an average thickness of the cured coating film is not greater than 80% of an average thickness of the coating film before being subjected to the film removing step.

In another embodiment, there is provided a non-transitory storage medium storing computer program to be used in a computer for controlling a substrate processing apparatus, wherein the computer program has steps for executing the foregoing substrate processing method.

In yet another embodiment, there is provided a heating apparatus for heating a substrate provided on its front surface with a coating film, the coating film contains components causing crosslinking reaction via surrounding oxygen upon being heated. The heating apparatus includes: a processing container defining a processing space in which the substrate is to be placed; a heating mechanism that heats the substrate placed in the processing space; an oxygen concentration adjusting unit that controls concentration control in the processing space; a control unit that outputs control signals such that a first step and a second step are performed by the heating apparatus, wherein the first step heats the substrate while an atmosphere having a first oxygen concentration, which does not cause the crosslinking reaction, is created in the processing space, whereby components contained in the coating film is gasified so that a thickness of the coating film is reduced, while preventing the coating film from being cured, wherein the second step heats the substrate while an atmosphere having a second oxygen concentration higher than the first oxygen concentration is created in the processing space, whereby the coating film is cured through the crosslinking reaction, and wherein the first step is performed under conditions ensuring that an average thickness of the cured coating film is not greater than 80% of an average thickness of the coating film before being subjected to the first step.

In the foregoing embodiments, after applying the coating liquid onto the patterned surface of the substrate thereby forming the coating film, the surface part of the coating film is removed through the heating process to the substrate so that unevenness of the surface caused by the pattern can be reduced. This technique does not require ultraviolet-ray irradiation, so that complicated structure of the apparatus for performing the aforementioned process is avoided and in-plane uniformity of the substrate processing is achieved.

DETAILED DESCRIPTION OF EMBODIMENTS

First Embodiment

Figure 1:
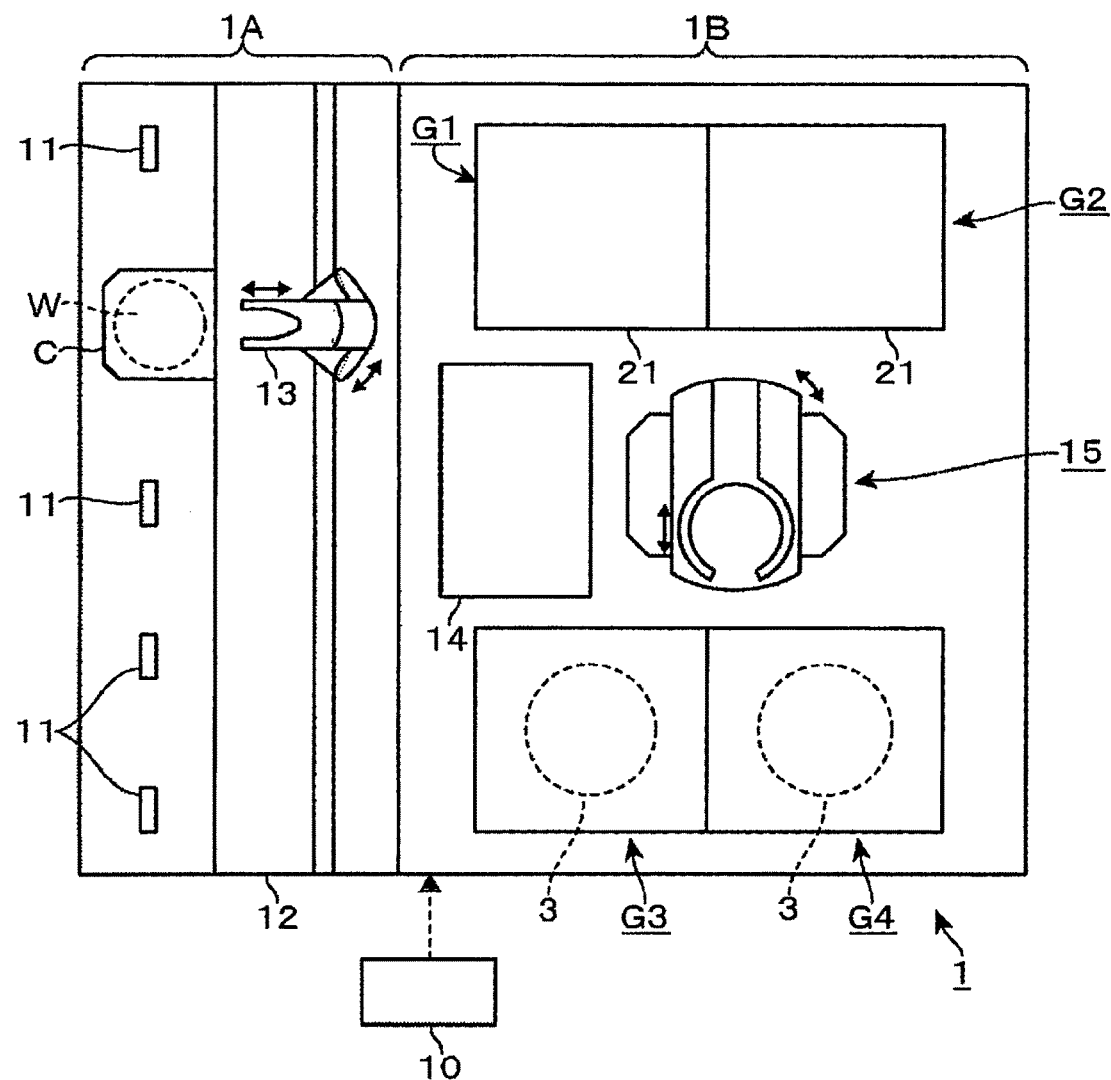
FIG. 1 is a top plan view of a film forming apparatus for performing a substrate processing method in one embodiment of the present invention.

A film forming apparatus 1 in one exemplary embodiment for performing a substrate processing method in one exemplary embodiment of the present invention will be explained with reference to a top plan view of FIG. 1. The film forming apparatus 1 is composed of a carrier station 1A and a processing station 1B, which are laterally connected to each other. In the below description, the side on the carrier station 1A is referred to as "front side" and the side on the processing station 1B is referred to as "rear side".

The reference sign C denotes a carrier. Wafers W, which are substrates, are housed in the carrier C, and the carrier C containing the wafers W is transported from outside the film forming apparatus 1 to the carrier station 1A. The carrier station 1A has a function for transferring the wafers W between the carrier C and the inside of the film forming apparatus 1. In order to perform the aforementioned transferring of the wafer W, the carrier station 1A is provided with a plurality of carrier tables 11 each for placing the carrier C thereon, which are aligned in the right and left direction. The carrier station 1A is equipped with a first wafer transport mechanism 13 that can move along a transport path 12 extending in the direction along which the carrier tables 11 are arranged. The first wafer transport mechanism 13 is capable of moving in the vertical direction and capable of rotating about the vertical axis, and is configured to transport each wafer W between the carrier C and the processing station 1B.

The processing station 1B includes a plurality of processing modules, which are apparatuses each for performing a predetermined process to the wafer W. The processing station 1B is provided with four processing blocks G1 to G4 in which various types of processing modules are arranged at plural levels. On the left side seen from the carrier station 1A to the processing station 1B, the first processing block G1 and the second processing block G2 are arranged in this order from the front side to the rear side. On the right side seen from the carrier station 1A to the processing station 1B, the third processing block G3 and the fourth processing block G4 are arranged in this order from the front side to the rear side. A transfer module 14 is interposed between the first processing block G1 and the third processing block G3 in the right and left direction. In the top plan view, a second wafer transport mechanism 15 is disposed to be surrounded by the processing blocks G1 to G4 and the transfer module 14.

The transfer module 14 is a module on which the wafer W is temporarily placed, when the wafer W is transferred between the second wafer transport mechanism 15 and the first wafer transport mechanism 13. The second wafer transport mechanism 15 transports the wafer W between the respective modules constituting the processing blocks G1 to G4 and the transfer module 14.

Each of the processing blocks G1 and G2 is formed by stacking at two levels coating modules 21 each for applying an organic material to a wafer W thereby forming an organic film thereon. Each of the processing blocks G3 and G4 is formed by stacking a heating module 3 that heats the wafer W on which the organic film has been formed to remove the surface part of the organic film and to cure the organic film, and a temperature regulating module that regulates temperature of the wafer W before the organic material is applied by the coating module 21.

Figure 2:
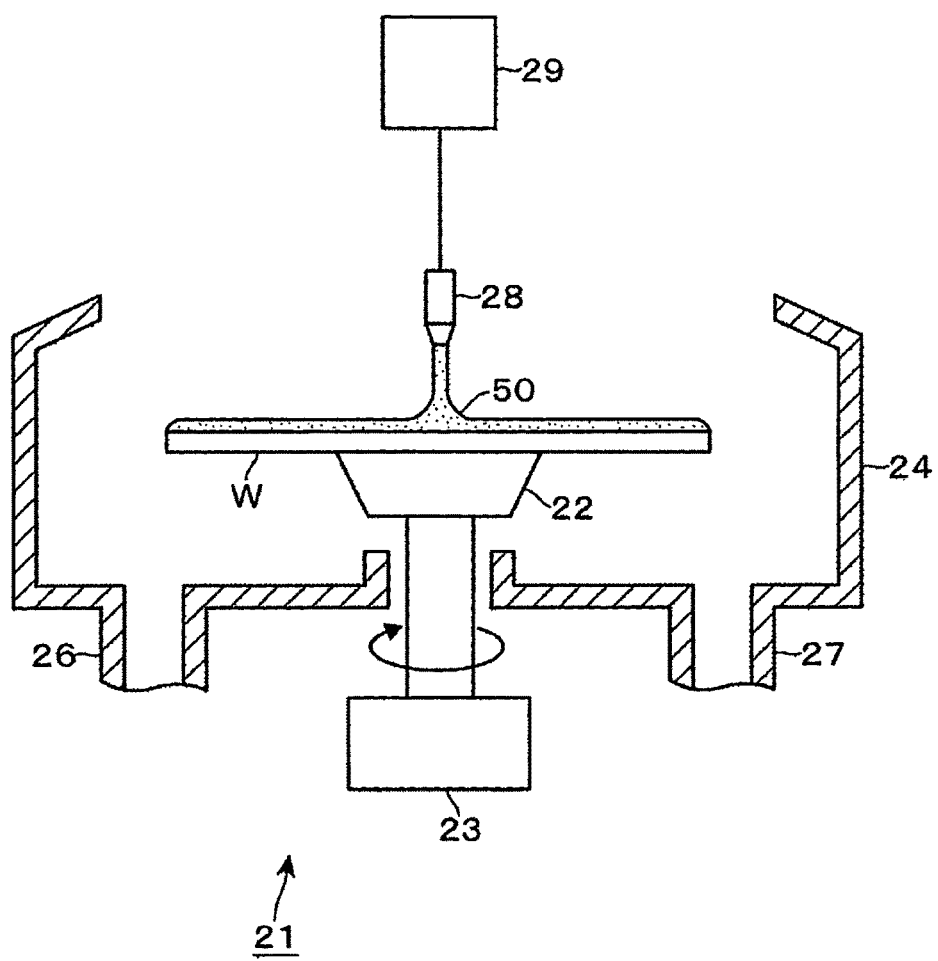
FIG. 2 is a vertically-sectioned schematic side view of an organic material coating module provided in the film forming apparatus.

The coating module 21 is explained with reference to the vertically-sectioned schematic side view of FIG. 2. The coating module 21 has a spin chuck 22 that horizontally absorbs and holds a central portion of the rear surface of the wafer W. The reference numeral 23 denotes a rotation mechanism that is capable of rotating the spin chuck 22 thereby rotating the wafer W about the vertical axis. In addition, the rotation mechanism 23 can elevate and lower the spin chuck 22, and can transfer the wafer W between the spin chuck 22 and the second wafer transport mechanism 15, at a position where the rotation mechanism 23 and the below-described cup 24 do not interfere with each other.

The cup 24 is disposed around the spin chuck 22, for receiving and collecting a liquid scattering or falling down from the wafer W. Connected to a lower surface of the cup 24 are a drain pipe 26 for draining the collected liquid, and an exhaust pipe 27 for evacuating an atmosphere in the cup 24. In addition, the coating module 21 has a coating nozzle 28. The coating nozzle 28 is configured to be movable in the horizontal direction and elevatable by a not-shown moving mechanism, whereby the coating nozzle 28 can move between a waiting area outside the cup 24 and a position above the central portion of the wafer W placed on the spin chuck 22. The reference numeral 29 denotes an organic material supplying source storing a liquid organic material 50, which is connected to the coating nozzle 28 through a duct. The organic material supplying source 29 includes a valve and a mass flow controller, and is configured to control feeding/shutting-off of the organic material 50 to the coating nozzle 28, in accordance with a control signal from the below-described control unit 10. The organic material 50 is explained in detail later.

Figure 3:
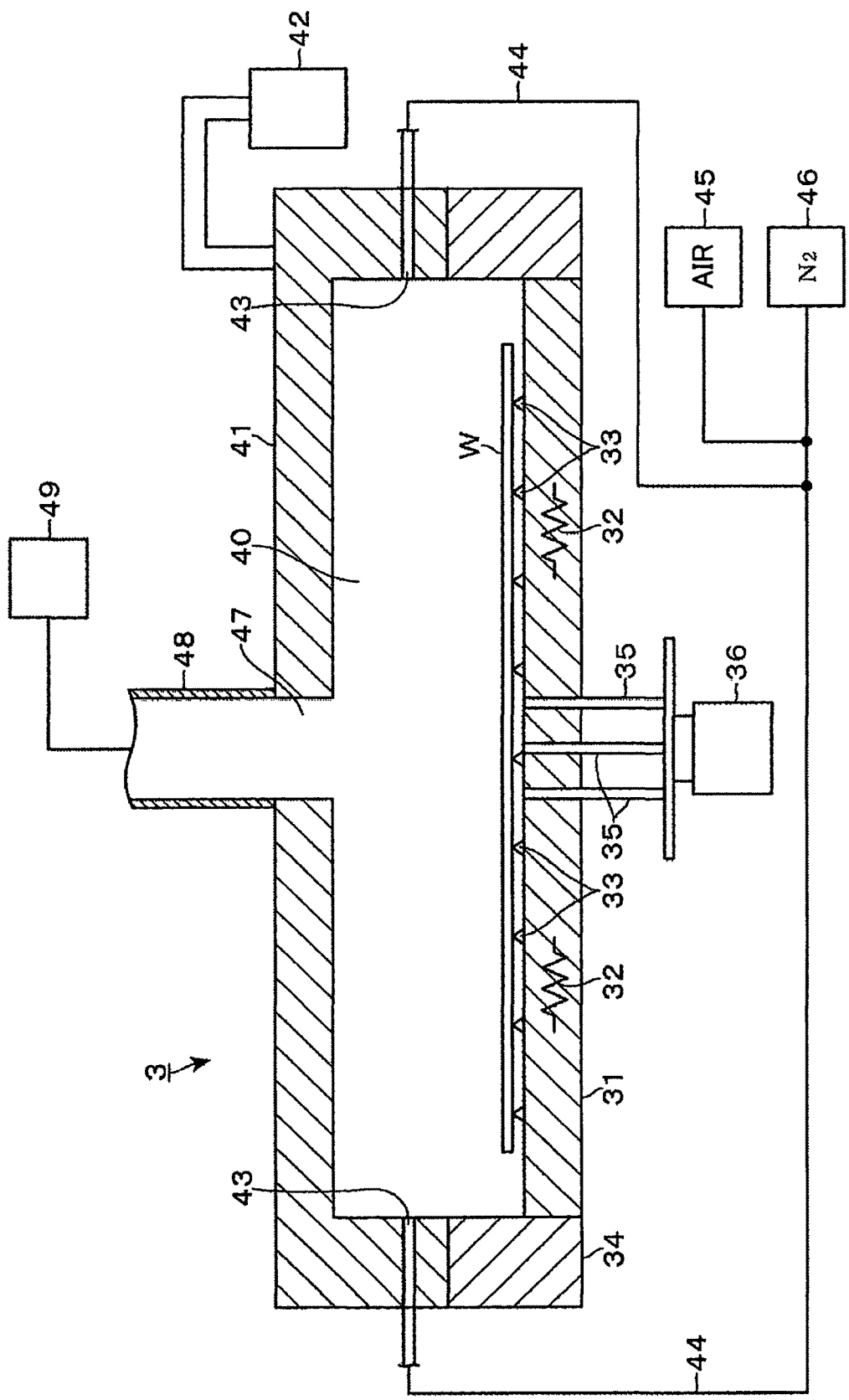
FIG. 3 is a vertically-sectioned side view of a heating module provided in the film forming apparatus.
Figure 4:
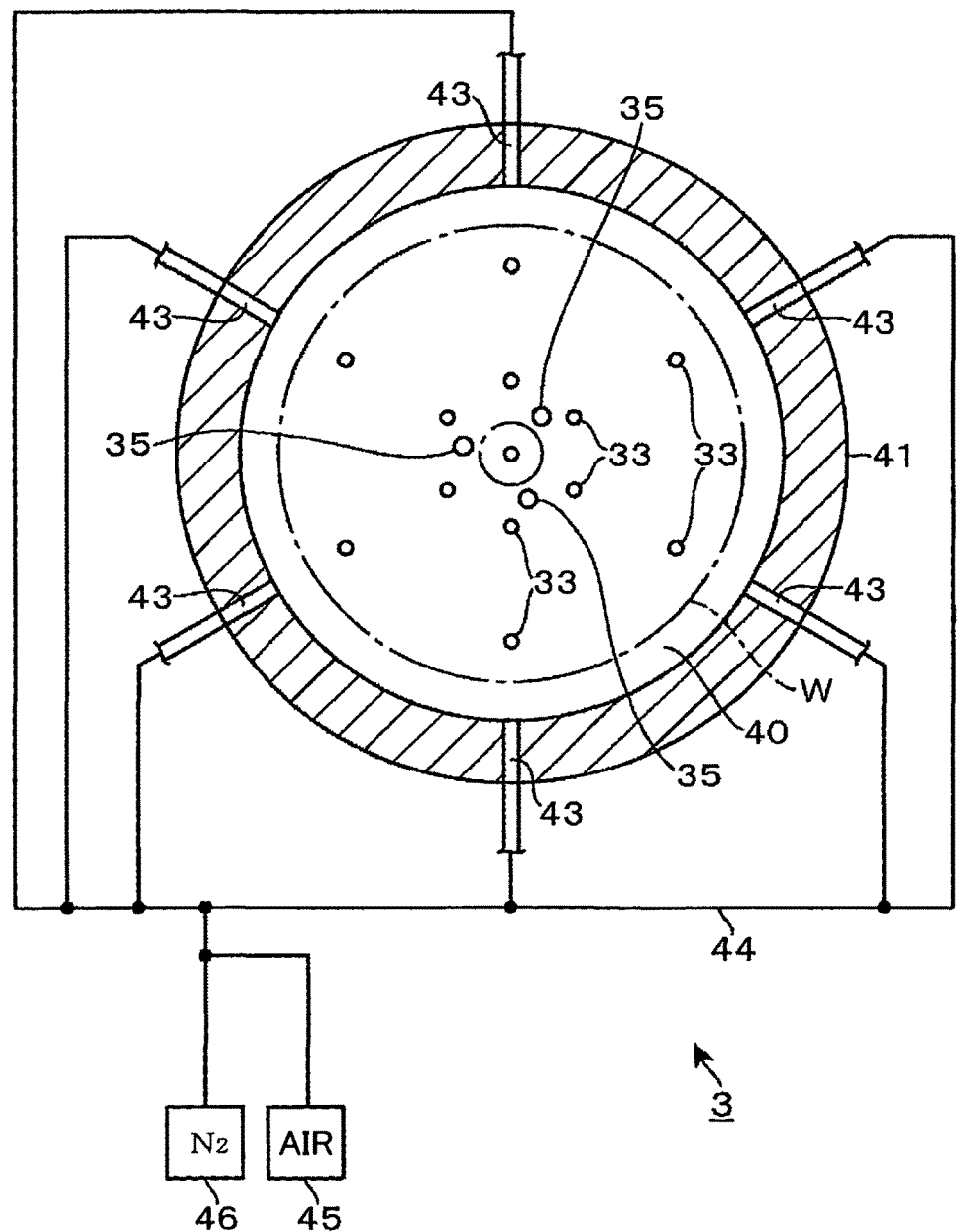
FIG. 4 is a laterally-sectioned top plan view of the heating module.

Next, the heating module 3, which is a heating apparatus, is explained with reference to the vertically-sectioned side view of FIG. 3 and the laterally-sectioned top plan view of FIG. 4. The reference numeral 31 denotes a horizontal heating plate having, e.g., a circular shape. The heating plate 31 has therein a heater 32. The surface of the heating plate 31, which is a heating mechanism, is provided with a plurality of support pins 33. The wafer W is heated with high in-plane uniformity, while the wafer W is horizontally held on a central portion of the heating plate 31 such that the wafer W slightly separated upward from the surface of the heating plate 31 by the support pins 33. The reference numeral 34 denotes a standing tubular member surrounding the periphery of the heating plate 31. The tubular member 34, together with the heating plate 31, constitutes a container main body. Three elevation pins 35 are provided to pass vertically through the heating plate 31. The elevation pins 35 are configured to be projectable and retractable to and from the heating plate 31 by an elevation mechanism 36, in order to transfer the wafer W between the heating plate 31 and the second wafer transport mechanism 15.

The reference sign 41 denotes a lid which is composed of, e.g., a circular top plate and a sidewall extending downward from the periphery of the top plate. The lid 41 is configured to be movable up and down relative to the heating plate 31, by an elevation mechanism 42. The lid 41, the heating plate 31 and the aforementioned tubular member 34 constitute a processing container. When the wafer W is subjected to a heating process, as shown in FIG. 3, the lower end of the sidewall of the lid 41 and the upper end of the tubular member 34 are brought into contact with each other, so that a hermetically closed processing space 40 is defined by the heating plate 31, the tubular member 34 and the lid 41. The processing space 40 has, e.g., a flat circular shape. A plurality of gas supplying ports 43 opening into the processing space 40 are formed in the sidewall of the lid 41. The respective gas supplying ports 43 are arranged at intervals along the circumferential direction of the lid 41, for example.

Downstream ends of gas supplying pipes 44 are respectively connected to the gas supplying ports 43. Upstream sides of the gas supply pipes 44 are merged with one another. Then, the merged gas supply pipe 44 is divided into two so as to be connected to an air supplying source 45 and an $N_2$ (nitrogen) gas supplying source 46. The air supplying source 45 and the $N_2$ gas supplying source 46, which constitute an oxygen concentration adjusting unit, respectively have valves and pumps. In accordance with a control signal from the below-described control unit 10, the air supplying source 45 and the $N_2$ gas supplying source 46 pressure-feed air and $N_2$ gas stored therein, respectively. By means of the air supplying source 45 and the $N_2$ gas supplying source 46, air and $N_2$ gas can be supplied to the processing space 40 in a switching manner.

An exhaust port 47 opening into the central part of the processing space 40 is formed in the lower surface of the top plate of the lid 41. The exhaust port 47 is connected to an evacuating mechanism 49 through an exhaust pipe 48. The evacuating mechanism 49 is composed of, e.g., a vacuum pump, a valve and so on, and is configured to evacuate the processing space 40 at a given displacement in accordance with a control signal from the control unit 10.

Next, the control unit 10 provided on the film forming apparatus 1 shown in FIG. 1 is explained. The control unit 10 includes a program, a memory and a data processing unit formed of a CPU. The program includes commands such that a control signal is sent to each unit of the film forming apparatus 1 to control the transfer operation between the respective modules and operations of parts/devices in the modules, thereby performing steps for a process. The program is stored in a storage medium of a computer, such as a flexible disk, a compact disk, a hard disk, an MO (magneto-optical disk) or memory card, and is installed in the control unit 10.

The organic material 50 used in the first embodiment is explained with reference to FIG. 5. The organic material 50 is a material for forming an organic film 51 that is a SOC film as described in the above-described "background art" part of this specification. The organic material 50 includes a solvent, and a crosslinking agent 52, a polymer 53 and a catalyst 54 which are low-molecular compounds. Upon application of the organic material 50 to the wafer W, the organic material 50 initially has fluidity. After the application process, the fluidity lowers through a heating process. In the description below, the organic material applied to the wafer W is referred to as "organic film", regardless of its fluidity.

Figure 5:
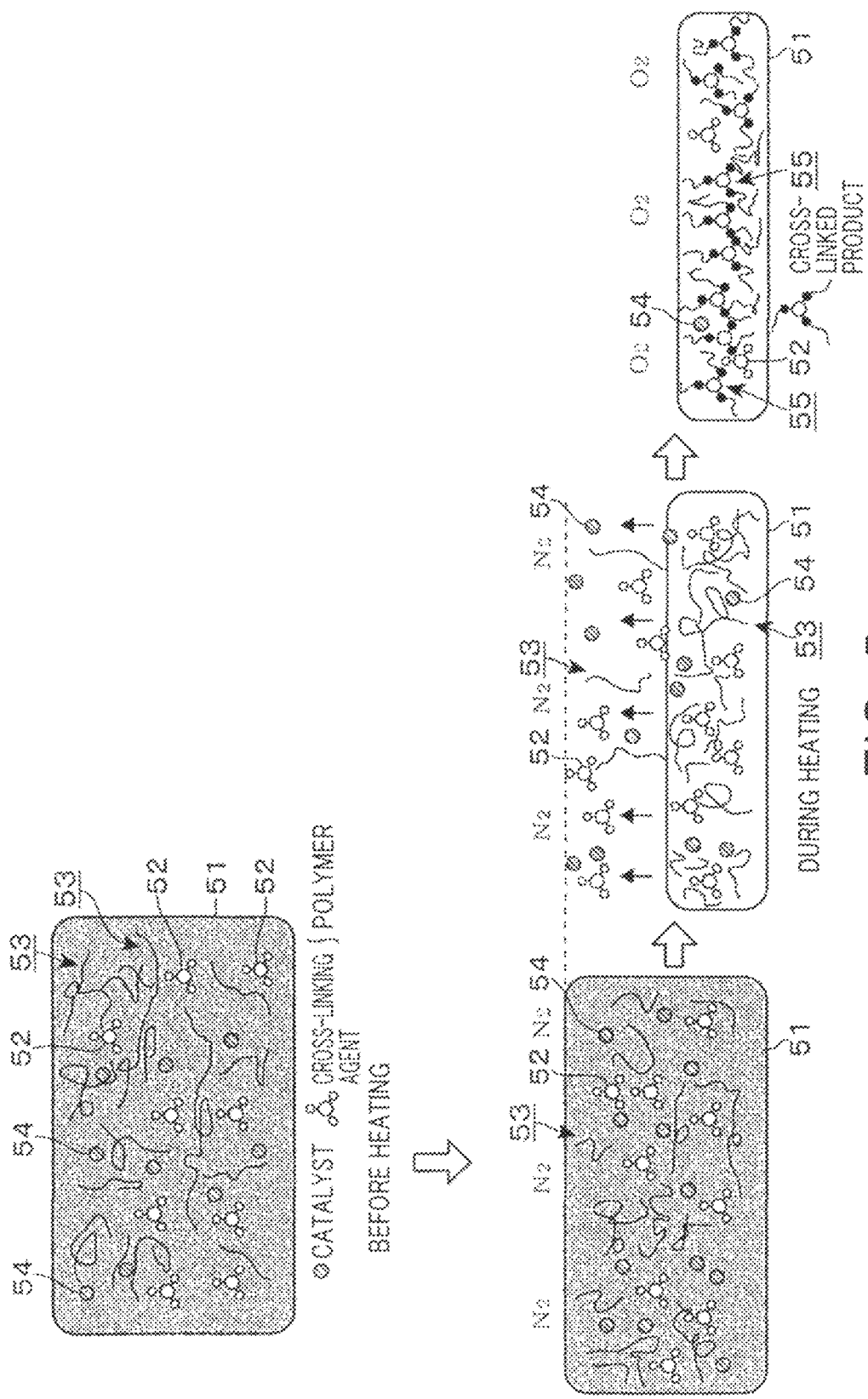
FIG. 5 is a schematic diagram showing the change of an organic film by a heating process.

The illustration in the upper row of FIG. 5 schematically shows the organic film 51 before it is heated by the heating module 3. When the organic film 51 is heated, the crosslinking agent 52 and the polymer 53 react with each other via oxygen existing around the organic film 51, so that the polymer 53 is polymerized. Namely, a crosslinking reaction occurs, whereby the fluidity of the organic film 51 lowers and the organic film 51 cures. The catalyst 54 is a catalyst for promoting the crosslinking reaction. Heating of the organic film 51 is explained in detail later. For the convenience of explanation, the organic material 50 and the organic film 51 which require oxygen in the surrounding atmosphere for promoting the crosslinking reaction are sometimes referred to as "organic material of thermal crosslinking type" and "organic film of thermal crosslinking type", respectively.

Next, a process performed by the film forming apparatus 1 is explained with reference to FIGS. 5 to 8. FIG. 5 shows the change of components contained in the organic film 51 through a heating process by the heating module 3. The height of each organic film 51 in the up and down direction in FIG. 5 corresponds to the film thickness of the organic film 51. FIG. 5 also shows the change of the film thickness of the organic film 51 during the heating process. In FIG. 5, the organic film 51 containing relatively a large amount of the solvent is dotted, while the organic film 51 containing relatively a small amount of the solvent having been heated is not dotted.

Figure 6:
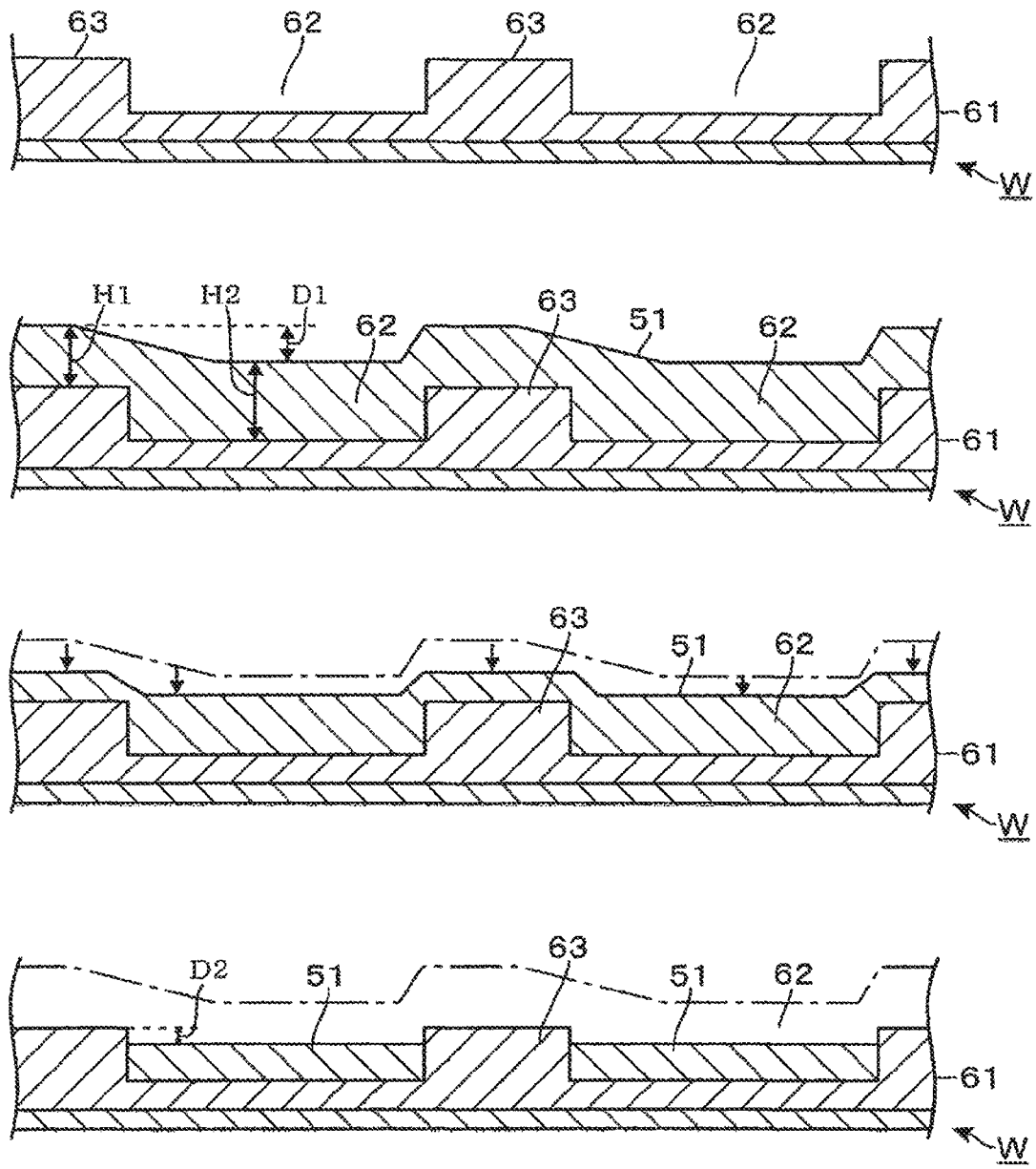
FIG. 6 is a schematic diagram showing the change of the surface of the wafer during a process performed by the film forming apparatus.
Figure 7:
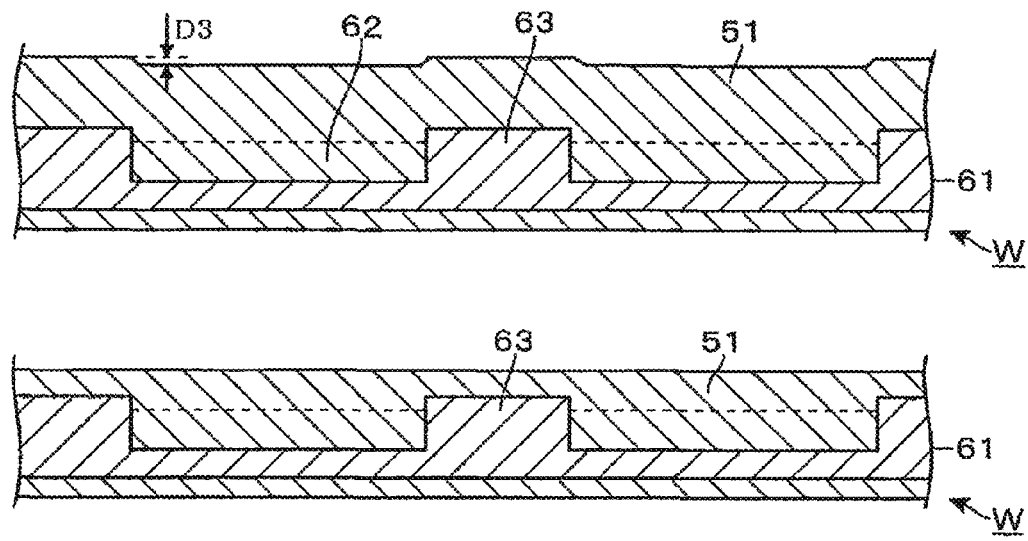
FIG. 7 is a schematic diagram showing the change of the surface of the wafer during a process performed by the film forming apparatus.
Figure 8:
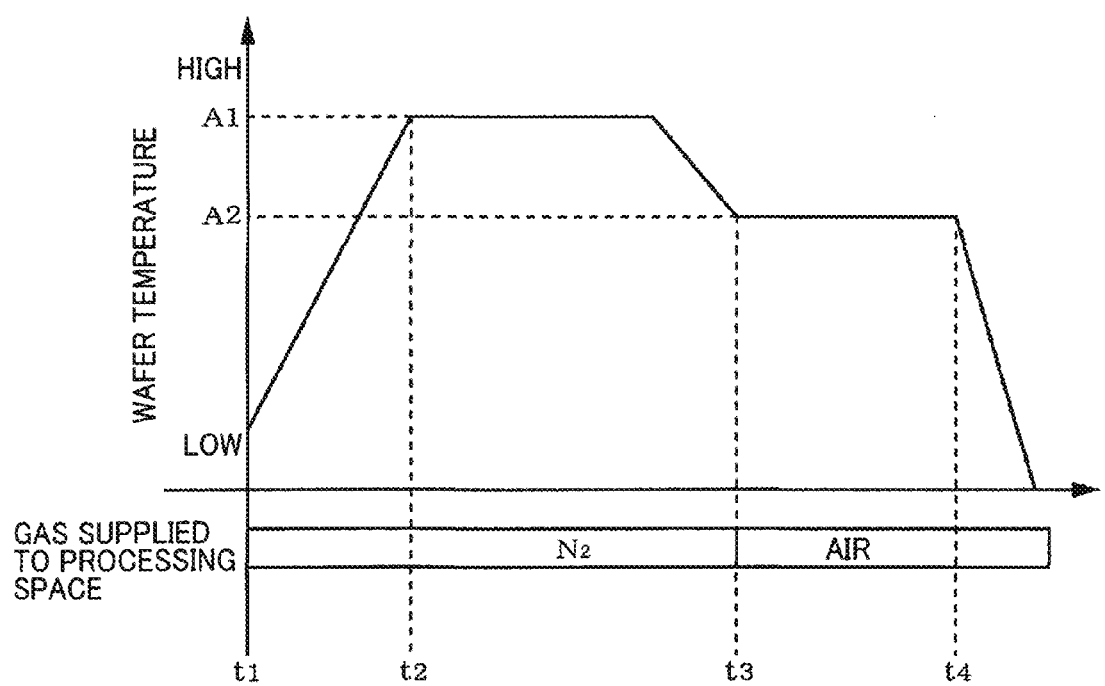
FIG. 8 is a time chart showing the change of the wafer temperature and the gas type during a heating process in a first embodiment.

FIGS. 6 and 7 show the change of the surface of the wafer W with the progress of the process. The illustration in the uppermost part of FIG. 6 shows the surface of the wafer W housed in the carrier C that is just transported to the film forming apparatus 1. A lower layer film 61 made of, e.g., $SiO_2$ (silicon oxide) is formed on the surface of the wafer W. The lower layer film 61 has recessed and projections in accordance with a predetermined pattern. Namely, steps are formed on the surface of the wafer W. Recessed parts and projecting parts, which form the pattern, are indicated by the reference numerals 62 and 63, respectively. The projecting part 63 forms a sidewall of the recessed part 62. The above-described organic film 51 serves as a mask when the lower layer film 61 is etched by an apparatus provided outside the film forming apparatus 1. FIG. 8 is a time chart showing the change of the temperature of the wafer W and the gas type during the process in the heating module 3. In this timing chart, the temperature change of the wafer W is shown by a line graph.

Herebelow, a transport path and a process to a wafer W are explained. A wafer W unloaded from the carrier C is firstly transported to the transfer module 14, and is then transported to the temperature regulating module of the processing block G3 or G4. After the temperature of the wafer W is adjusted to a predetermined value, the wafer W is transported into the coating module 21 and is transferred to the spin chuck 22. The wafer W is rotated by the spin chuck 22, and the aforementioned organic material 50 of thermal crosslinking type is supplied from the coating nozzle 28 to the central portion of the rotating wafer W. The organic material 50 spreads out over the whole surface of the wafer W by the centrifugal force generated by the rotation of the wafer W. Namely, the organic material 50 is applied to cover the lower layer film 61 by spin coating, so that the organic film 51 is formed. FIG. 2 shows the wafer W onto which the organic material 50 is being applied.

The illustration in the second part from the top of FIG. 6 shows the wafer W on which the organic film 51 is formed. Because of the surface tension and the viscosity of the organic material 50, step D1 is formed on the surface of the organic film 51, correspondingly to the pattern shape of the lower layer film 61. The state of the organic film 51 at this time is explained in more detail. When the height from the surface of the projecting part 63 to the upper surface of the organic film 51 is defined as "H1" and the height from the bottom surface of the recessed part 62 to the upper surface of the organic film 51 is defined as "H2", H1 is smaller than H2 (H1<H2).

After the organic film 51 is formed as described above, the wafer W is transported to the heating module 3 and is placed on the heating plate 31. The lid 41 is closed so that the hermetically closed processing space 40 is formed. Discharging of air from the processing space 40 via the exhaust port 47 and the supply of $N_2$ gas via the gas supplying ports 43 are started. When the processing space 40 has an $N_2$ gas atmosphere so that an oxygen concentration in the processing space 40 reaches a relatively low first oxygen concentration, e.g., an oxygen concentration of 20 ppm or below, the temperature of the heating plate 31 is raised to start the heating process, whereby the temperature of the wafer W increases (timing t1 in the chart of FIG. 8). The left illustration in the lower row of FIG. 5 shows the organic film 51 while the temperature of the wafer W increases. Because of the heating process to the wafer W, drying of the solvent contained in the organic film 51 is promoted, and the crosslinking agent 52, the polymer 53 and the catalyst 54 which are low-molecular compounds, start to sublimate from the surface of the organic film 51. Due to the sublimation and the drying of the solvent, film loss (reduction in film thickness) of the organic film 51 occurs.

When the heating process is continued, since the oxygen concentration of the processing space 40 is low as described above, crosslinking reaction of the polymer 53 does not occur. When the temperature of the wafer W further increases to reach a temperature not less than the heat-resistant temperatures of the low-molecular compounds, namely, temperature A1 at which the low-molecular compounds decompose (timing t2), the temperature is then maintained at the temperature A1. As described later by taking an example, when reaction products (cross-linked products) are generated by the crosslinking reaction, movement of the low-molecular compounds in the organic film is prevented by the cross-linked products. However, in this heating process, since no crosslinking reaction occurs in the organic film 51, the low-molecular compounds can move relatively easily in the organic film 51 toward the surface of the organic film 51 so as to sublimate from the surface to an atmosphere around the organic film 51. Due to the advancement of the sublimation, as shown in the central illustration in the lower row of FIG. 5 and the illustration in the third part from the top of FIG. 6, the film loss of the organic film 51 further progresses.

When the film loss amount reaches a desired amount, the temperature of the heating plate 31 is lowered, and the temperature of the wafer W is maintained at temperature A2 that is lower than the temperature A1, for example. The gas supplied from the gas supplying ports 43 into the processing space 40 is switched from the $N_2$ gas to air (timing t3) so that the oxygen concentration of the processing space 40 increases to reach a second oxygen concentration that is higher than the first oxygen concentration. Then, the cross-linking reaction advances by oxygen in the organic film 51. Thus, as shown in the right illustration in the lower row of FIG. 5, the polymers 53 are polymerized to generate cross-linked products 55 which are polymeric compounds, whereby the organic film 51 cures so that the organic film 51 has a predetermined film quality. The cross-linked products 55 have a network molecular structure, for example.

After the wafer W is continuously heated at the temperature A1 for a predetermined period of time, the temperature of the heating plate 31 is lowered (timing t4). Thus, since the temperature of the wafer W decreases, the crosslinking reaction stops so that the heating process is finished. The illustration of the fourth part from the top of FIG. 6 shows the wafer W upon completion of the heating process. Outside the recessed part 62, the organic film 51 is removed by the heating process at the temperature A1; and the lower layer film 61 is exposed. On the other hand, as shown by the illustration in the second part from the top of FIG. 6, upon formation of the organic film 51, the thickness H1 of the organic film 51 on the projecting part 63 is smaller than the thickness H2 of the organic film 51 on the bottom surface of the recessed part 62. Thus, the organic film 51 remains in the recessed part 62. Since the organic film 51 remains in the recessed part 62, step D2 on the surface of the wafer W upon the stopping of the heating process, is smaller than the step D1 on the surface of the wafer W after the formation of the organic film 51 and before the heating process. The average thickness of the cured organic film 51 remaining in the recessed part 62, which is obtained by measuring plural positions in the plane of the wafer W, is represented as "R1". In addition, the average thickness of the organic film 51 before the heating process, which is obtained by measuring plural positions in the plane of the wafer W, is represented as "R2". The sublimation of the surface of the organic film 51 is performed under a condition ensuring that the average thickness "R1" is not greater than 80% of the average thickness R2.

Thereafter, the evacuation through the exhaust port 47 and the supply of air from the gas supply ports 43 are stopped. The lid 41 is opened, and the wafer W is unloaded from the processing space 40. Then, the wafer W is transported again to the temperature regulating module of the processing block G3 or G4, and the temperature of the wafer W is regulated. After that, the wafer W is transported into the coating module 21, and the second application of the organic material 50 is performed therein by spin coating. The illustration in the upper part of FIG. 7 shows the wafer W which is subjected to the second application. As described above, upon the second application of the organic material 50, since the organic film 51 is formed in the recessed part 62, the step D2 on the surface of the wafer W is smaller than the step on the surface of the wafer W which was made upon the first application of the organic material 50. Thus, a step D3 on the surface of the organic film 51, which was made after the second application, is smaller than the step D1 of the organic film which was made after the first application. Namely, the surface of the organic film 51 after the second application has a higher flatness than the surface of the organic film 51 after the first application.

After the second application of the organic material 50 is performed as described above, the wafer W is transported to the heating module 3 and is subjected to the second heating process. The second heating process is performed similarly to the first heating process. Thus, an $N_2$ gas atmosphere is established in the processing space 40 in order to avoid occurrence of the crosslinking reaction, and the wafer W is heated therein to have the relatively high temperature A1, whereby the low-molecular compounds sublimate from parts of the organic film 51 formed by the second application of the organic material 50, so that the film loss of the organic film 51 advances.

Then, under the condition where, e.g., the organic film 51 covers the whole surface of the under layer film 61, namely, the organic film 51 remains on the projecting parts 63 of the under layer film 61, air atmosphere is established in the processing space 40 and the wafer W is heated at the temperature A2 that is lower than the temperature A1. Thus, the film loss caused by the second heating process stops, and the crosslinking reaction advances at parts of the organic film 51 formed by the second application of the organic material 50. Thereafter, the temperature of the wafer W is lowered so that the crosslinking reaction stops, so that the second heating process is finished. The lower illustration in FIG. 7 shows the wafer W upon completion of the second heating process. As described above, since the flatness of the surface of the organic film 51 formed by the second application is high, the flatness of the surface of the organic film 51 is high after the film loss and the crosslinking reaction occurred in the second heating process. After the second heating process, the wafer W is unloaded from the heating module 3, and is returned to the carrier C through the transfer module 14.

Figure 9:
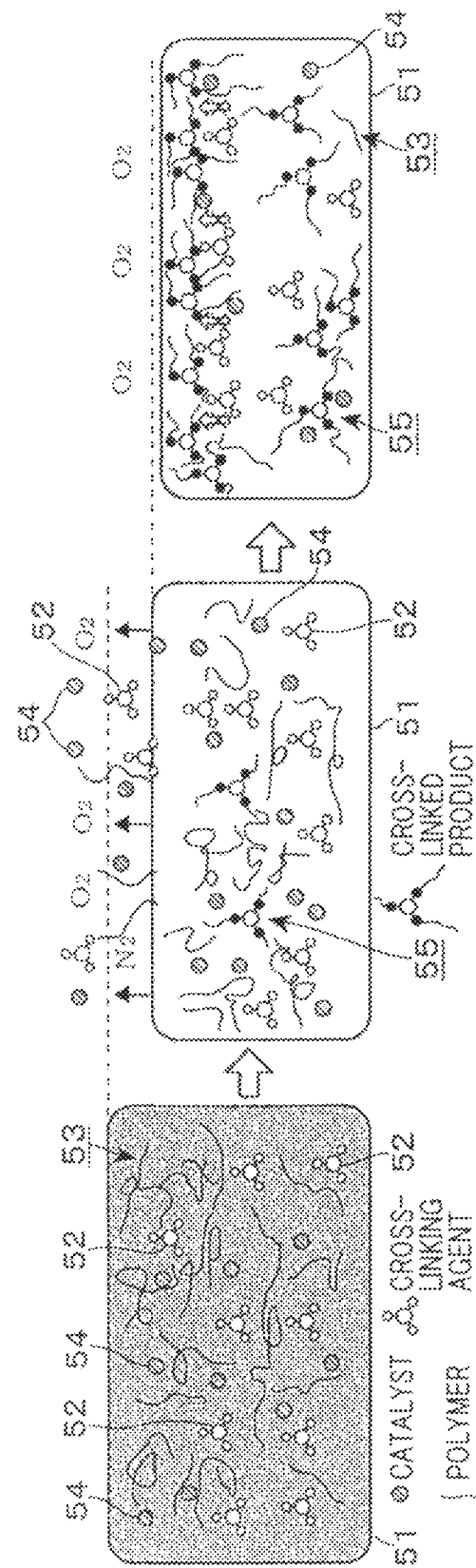
FIG. 9 is a schematic diagram showing the change of an organic film during a heating process in a comparative example.

In order to clarify the reason why the heating process is performed in the heating module 3 in such a manner that the oxygen concentration of the processing space 40 is changed in a switching manner, a heating process in a comparative example that is performed in the heating module 3 is explained with reference to FIG. 9 schematically showing the states of the organic film 51 similarly to FIG. 5. In the heating process in the comparative example, no $N_2$ gas is supplied into the processing space 40, whereby the processing space 40 is maintained in the air atmosphere from the start of the heating process to the end of the heating process. Namely, the oxygen concentration is maintained relatively high.

The left illustration of FIG. 9 shows the organic film 51 at the start of the heating process. When the wafer W is heated to increase its temperature, the solvent dries and sublimation of the low-molecular compounds starts. At this time, since a relatively great amount of oxygen exists around the organic film 51, the crosslinking reaction of the polymer 53 starts. Thus, cross-linked products are generated as shown by the central illustration of FIG. 9. As the crosslinking reaction further progresses, the cross-linked products 55 form a network molecular structure so that the organic film 51 cures. In this case, the low-molecular compounds in the organic film 51, which are to move toward the surface of the organic film 51 by the heating process, are captured in the cross-linked products 55 having the network molecular structure and are prevented from moving toward the surface. Thus, the low-molecular compounds are prevented from sublimating from the organic film 51 into the surrounding atmosphere. Namely, as shown in the right illustration of FIG. 9, the low-molecular compounds remain in the organic film 51. As a result, in the heating process in the comparative example, the film loss amount of the organic film 51 from the start to the end of the heating process is smaller. Thus, the reduction of unevenness of the organic film 51 utilizing the film loss explained with reference to FIG. 6 cannot be achieved.

In the film forming method using the above-described film forming apparatus 1, the organic material 50 is applied to the wafer W, which has an uneven surface caused by the pattern of the under layer film 61, to form thereon the organic film 51. Then, the wafer W is heated in an atmosphere having a relatively low oxygen concentration in order to prevent the crosslinking reaction from occurring. Thus, the low-molecular compounds contained in the organic film 51 are sublimated, so that the surface part of the organic film 51 is removed. After the unevenness of the surface of the wafer W is reduced by the removal, the wafer W is heated in an atmosphere having a relatively high oxygen concentration in order to progress the crosslinking reaction. Thereafter, the organic material 50 is again applied to the wafer W to form thereon the organic film 51. Due to such a process, the unevenness of the surface of the organic film 51 can be reduced. Thus, for the purpose of forming the organic film 51 having a surface of a high flatness, it is not necessary for the film forming apparatus 1 to include a device for irradiating the wafer W with ultraviolet ray so as to remove the surface part of the organic film 51, as described in the "background art". Thus, in-plane uniformity of the process to the wafer W can be improved, while the film forming apparatus 1 has a simple structure. In the above embodiment, the surface part of the organic film is removed by sublimation. However, as long as the surface part of the organic film can be removed by gasification, the surface part may be changed from the solid state directly into the gaseous state to be removed, or may be changed into the liquid state and thereafter into the gaseous state to be removed.

In the aforementioned process, the temperature A1 of the wafer W when the $N_2$ gas atmosphere is established in the processing space 40 is a temperature not less than the heat-resistant temperature of each low-molecular compound, in order to sublimate the low-molecular compounds. In addition, in order to increase the film loss amount and to rapidly promote the film loss, the temperature A1 is preferably set at a highest possible temperature, as long as the film quality of the organic film 51 is not impaired after the crosslinking reaction occurred under such a temperature. Since it is preferable that the temperature A1 is high, the temperature A1 in the above process is set higher than the temperature A2 of the wafer W, which is the temperature when the air atmosphere is established in the processing space 40. However, as long as the temperature A2 allows the progress of the crosslinking reaction and the desired film quality of the organic film 51, the temperature A2 may be set higher than the temperature A1 or may be the same as the temperature A1.

In the above process, the $N_2$ gas is supplied into the processing space 40 from the timing "t1" to the timing "t3" in the time chart of FIG. 8, in order to lower the oxygen concentration of the processing space 40. However, as long as an atmosphere of an oxygen concentration at which the crosslinking reaction does not occur is established, the gas to be supplied is not limited to the $N_2$ gas, but may be Ar (argon) gas for example. The oxygen concentration at which the crosslinking reaction does not occur means an oxygen concentration at which the crosslinking reaction does not substantially occur. Thus, an oxygen concentration at which the crosslinking reaction slightly occurs is included in the oxygen concentration at which the crosslinking reaction does not occur. In addition, air is supplied into the processing space after the timing "t3", in order to increase the oxygen concentration of the processing space 40. However, as long as the oxygen concentration allows the occurrence of the crosslinking reaction, the processing space 40 may have a higher or lower oxygen concentration than the oxygen concentration in the air.

In addition, in the above process, although the application process of the organic material 50 and the heating process of the organic film 51 are respectively repeated twice, the processes may be respectively repeated three times or more. Alternatively, as long as the unevenness of the organic film can be reduced, it is not necessary to perform the application process and the heating process repeatedly, that is, each process may be performed only once. In a case where each process is performed only once the film loss is stopped before the projecting part 63 is exposed, unlike the process example shown in FIGS. 6 and 7 where the film loss caused by the first heating process is performed until the projecting part 63 of the under layer film 61 is exposed. Also in the case where the application process and the heating process are respectively repeated plural times, it is not necessary to perform the first heating process to cause film loss until the projecting part 63 is exposed. Moreover, the step on the surface of the organic film 51, which is formed by the second application process, is relatively small. Thus, in the second heating process, an air atmosphere may be formed in the processing space 40 from the start to the end of the heating process, without forming any $N_2$ gas atmosphere in the processing space 40.

Figure 10:
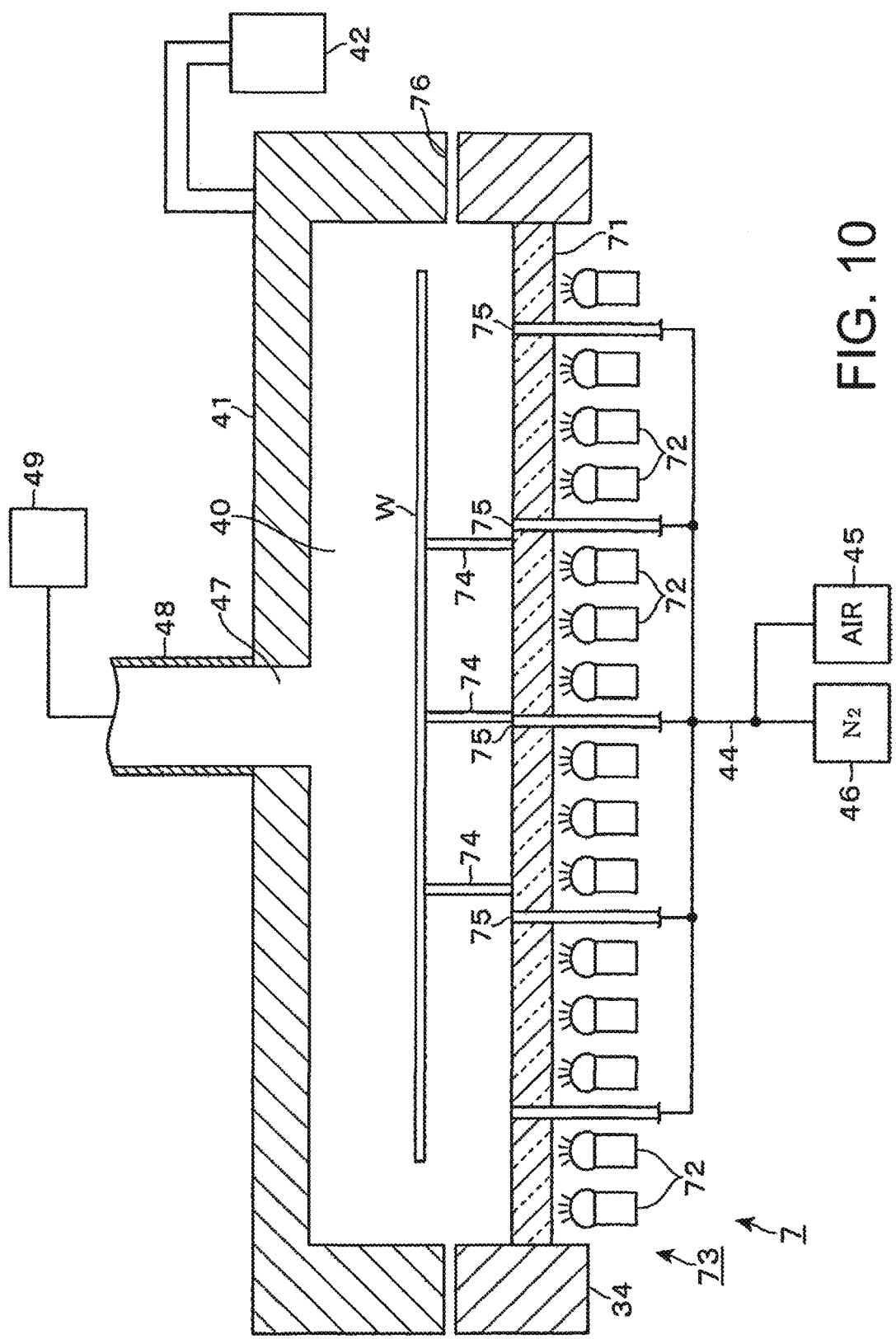
FIG. 10 is a vertically-sectioned side view showing another configuration of the heating module.

Next, a heating module 7 as another configuration example of the heating module is explained with reference to FIG. 10 showing its vertically-sectioned side view, focusing on a difference from the heating module 3. The heating module 7 includes a horizontal light transmission plate 71, instead of the heating plate 31. The light transmission plate 71 is made of quartz. Below the light transmission plate 73, there is disposed a light emitting unit 73 which is a heating mechanism composed of a plurality of light emitting diodes 72 that are horizontally arrayed. Each light emitting diode 72 emits light upward. The surface of the light transmission plate 72 is provided thereon with a plurality of support pins 74, extending upward. A wafer W is horizontally supported on the tip of each support pins 74.

Light emitted from each light emitting diode 72 transmits the light transmission plate 71 so as to be supplied to the whole rear surface of the wafer W supported on the support pins 74, whereby the wafer W is heated. In FIG. 10, the reference numeral 76 denotes a narrow gap between the lid 41 and the tubular member 34. By means of the support pins 74 which constitute a support part, the wafer W is supported at a level higher than the gap 76, i.e., above the lower end of the lid 41. In addition, a plurality of gas supplying ports 75 are opened in the surface of the light transmission plate 71 toward the central portion and peripheral portion of the wafer W. Gas supplying pipes 44 that supply $N_2$ gas and air into the processing space 40 are connected to the gas supplying ports 75 from below the light transmission plate 71.

Figure 11:
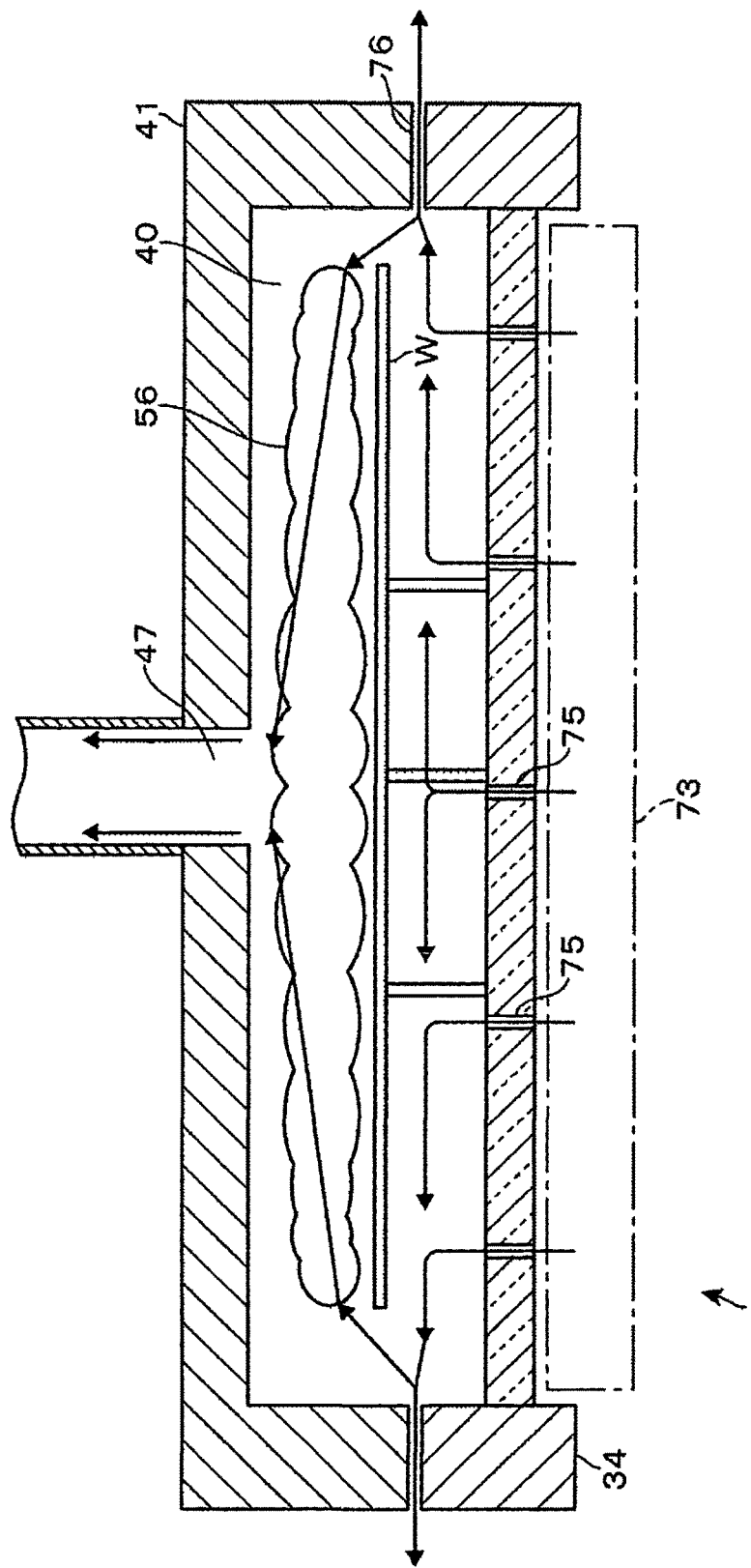
FIG. 11 is an explanatory diagram showing a gas flow in the heating module.

In accordance with the timing chart shown in FIG. 8, for example, the operation of the heating module 7 is controlled such that the temperature of the wafer W and the type of gas to be supplied are changed. FIG. 11 shows the situation where $N_2$ gas is supplied into the processing space from timing "t1" to timing "t3" in the chart, in the heating module 7 whose operation is thus controlled. The $N_2$ gas flow is shown by arrows. In FIG. 11, reference sign 56 indicates sublimated products which are sublimated low-molecular compounds from the organic film 51 on the surface of the wafer W.

The flow of gas is explained. The $N_2$ gas supplied into the processing space 40 through the gas supplying ports 75 toward the rear surface side of the wafer W flows from the central part toward the peripheral part of the wafer W, because the gas is discharged from the exhaust port 7. A part of the $N_2$ gas goes outside the processing space 40 through the gap 76, and another part of the $N_2$ gas makes a turn around the outer circumference of the wafer W to flow along the peripheral portion of the front surface of the wafer W. The thus turned $N_2$ gas flows along the front surface of the wafer W from the peripheral portion toward the central portion, and then is discharged from the exhaust port 47. The sublimated products 56 are forced to flow toward the exhaust port 47 by the $N_2$ gas flowing along the front surface of the wafer W, so as to be removed from the processing space 40.

As described above, since the $N_2$ gas is supplied onto the rear surface of the wafer W and the $N_2$ gas turns to flow along the front surface of the wafer W, it can be prevented that the sublimated products 56 turns from the front surface to the rear surface of the wafer W and adhered thereto. In addition, since the wafer W is supported at a level higher than the gap 76 of the processing container and the sublimated products 56 are prevented from going toward the rear surface side of the wafer W, i.e., going into a space below the wafer W, as described above, the sublimated products 56 are prevented from leaking to the outside of the processing space 40 through the gap 76. Namely, it is not necessary to ensure gas tightness of the processing space 40, whereby the module may have a simple configuration. Similarly to the gas flow formed upon supply of the $N_2$ gas as described above, the same flow is formed when air is supplied. Thus, similarly to above, adhesion of the sublimated products 56 to the rear surface of the wafer W and leakage of the sublimated products 56 to the outside of the processing container can be prevented. The heating module 7 may have a structure such that the height position of the lid 41 is fixed, and that the light transmission plate 71, the light emitting unit 73 and the tubular member 34, which constitute the container main body, are elevated and lowered. Also in this case, by arranging the wafer W and the exhaust port 47 as described above, leakage of the sublimated products from the gap 76 between the lid and the container main body can be prevented. In addition, the light emitting unit 73 may be configured to emit light from the front surface side of the wafer W so as to heat the wafer W.

Second Embodiment

As a second embodiment, there is explained a film forming process that uses an organic material different from the organic material 50 of thermal crosslinking type explained in the first embodiment. The organic material in the second embodiment includes a compound containing, e.g., acid, in addition to the solvent, the crosslinking agent 52, the polymer 53 and the catalyst 54. Thus, owing to the aid of the acid, the crosslinking reaction progresses even if the surrounding atmosphere has a low oxygen concentration. An organic material and an organic film which do not need surrounding oxygen for the progress of the crosslinking reaction are sometimes referred to as "organic material of acidic crosslinking type" and "organic film of acidic crosslinking type", respectively. Excluding that the organic material does not need surrounding oxygen, the organic material in the second embodiment is the same as the organic material in the first embodiment.

Figure 12:
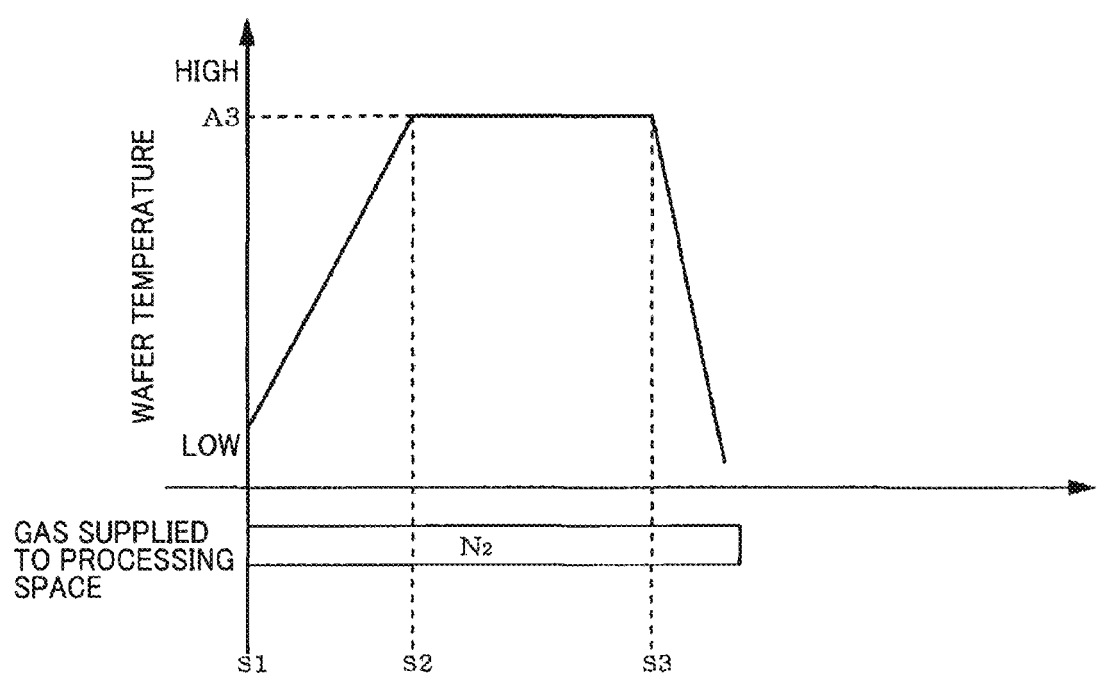
FIG. 12 is a time chart showing the change of the wafer temperature and the gas type during a heating process in a second embodiment.

An example of the heating process performed by the heating module 3 to a wafer W on which the organic film of acidic crosslinking type is explained with reference to FIG. 12. Similarly to FIG. 8, FIG. 12 is a time chart showing the change of the temperature of the wafer W and the type of gas supplied into the processing space 40. By supplying $N_2$ gas into the processing space 40 and evacuating the processing space 40, the oxygen concentration of the processing space 40 decreases to become an oxygen concentration of 20 ppm or below, similarly to the first embodiment, for example, increase of temperature of the wafer W is started by heating the same (timing "s1"). Then, the temperature of the wafer W reaches temperature A3 that is not less than the heat-resistant temperature of each low-molecular compound in the organic film (timing "s2"). The temperature A3 is a temperature at which the crosslinking reaction substantially progresses.

Since the oxygen concentration of the processing space 40 is low, the organic film is heated while oxidation reaction between the oxygen and the respective components in the organic film is restrained. Thus, the crosslinking reaction in the organic film and the film loss progress simultaneously, while deterioration of the film quality caused by the oxidation reaction is restrained. When the film loss amount reaches a desired amount, the temperature of the wafer W is decreased (timing "s3"). Thereafter, the supply of the $N_2$ gas and the evacuation of the processing space 40 are stopped, so that the heating process is completed. As described in the first embodiment, also in the heating process in the second embodiment, the film loss is performed under the condition ensuring that the average thickness R1 of the organic film 51 that remains after the heating process is not greater than 80% of the average thickness R2 of the organic film 51 before the heating process.

In the second embodiment, in order to achieve a good film quality of the organic film, the heating process is performed in an atmosphere having a low oxygen concentration. In the second embodiment, the wafer W is transported inside the film forming apparatus 1 so as to be processed, and an organic film having a highly flattened surface is formed, similarly to the first embodiment, excluding that the different temperature control of the wafer W is performed and the gas supplied to the processing space 40 is not switched in the heating module 3, for example. However, also in the second embodiment, air may be supplied after the $N_2$ gas is supplied, similarly to the first embodiment. Not limited to the heating process performed at the temperature A1 continuously, the temperature may be changed. In addition, the process may be performed by using the heating module 7 instead of the heating module 3. In addition, in the second embodiment, since the crosslinking reaction can occur without supplying air as mentioned above, the heating modules 3 and 7 may be configured not to supply air into the processing space 40.

The oxygen concentration of the processing space 40 is 20 ppm or below as an oxygen concentration at which the crosslinking reaction does not occur in the first embodiment, or as an oxygen concentration at which oxidation of the organic film as a coating film is restrained. However, if the oxygen concentration is 100 ppm or below, the crosslinking reaction of molecules does not occur and oxidation of the coating film can be restrained. Thus, the heating process may be performed at such an oxidation concentration. In addition, instead of the foregoing cases where the organic film is formed by using the organic material, in a case where a chemical liquid for forming an antireflection film under a resist film is used for forming the antireflection film, the antireflection film having a surface of a high flatness can be formed by performing the processes as described in connection with the foregoing embodiments. Namely, the application of the foregoing embodiments is not limited to formation of an organic film. In addition, in the foregoing embodiments, during the heating process for the film loss, an atmosphere of the processing space 40 is not limited to the normal pressure atmosphere, and may be a reduced pressure atmosphere.

EVALUATING EXPERIMENTS

Evaluating Experiment 1

Next, evaluating experiments conducted in relation to the foregoing embodiments are explained. In an evaluating experiment 1, wafers W to which the organic material 50 of thermal crosslinking type is applied to form thereon the organic film 51, which are described in the first embodiment, are processed in different manners. As an evaluating experiment 1-1, the heating process was performed for 60 seconds in the heating module 3 while the air atmosphere was formed in the processing space 40. As an evaluating experiment 2, the ultraviolet irradiation described in the "background art" part was performed for 60 seconds to remove the surface part of the organic film 51. As a third evaluating experiment 1-3, $N_2$ gas was supplied into the processing space 40 similarly to the first embodiment to create an atmosphere having a low oxygen concentration in the processing space 40 in order to prevent occurrence of crosslinking reaction, the wafer W was subjected to the heating process for 60 seconds, so that the surface part of the organic film 51 was sublimated and removed. Film thicknesses of the organic films 51 of the processed wafers W were measured.

Figure 13:
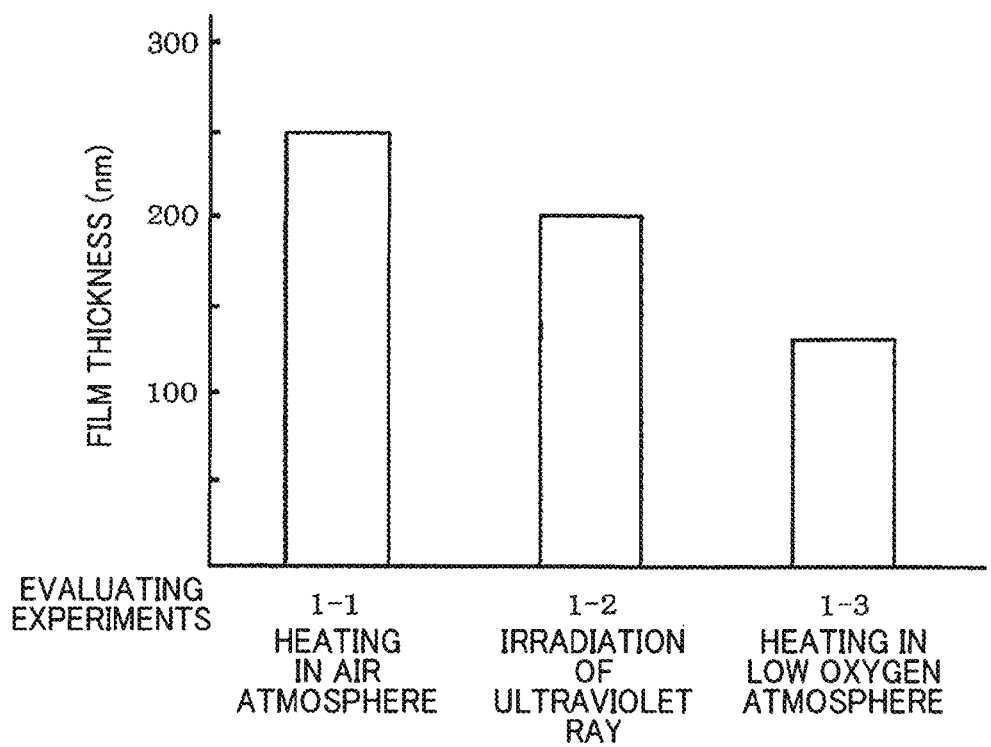
FIG. 13 is a graph showing the result of an evaluating experiment.

The graph of FIG. 13 shows the result the evaluating experiment 1. An axis of ordinate in the graph represents a film thickness (unit: nm). The film thicknesses were 249 nm, 202 nm and 132 nm in the evaluating experiments 1-1, 1-2 and 1-3, respectively. As compared with the evaluating experiment 1-1 in which the surface part of the organic film 51 was not removed, film loss of 47 nm occurred in the evaluating experiment 1-2 and film loss of 117 nm occurred in the evaluating experiment 1-3. Namely, the method of the present invention provides a large film loss per unit time as compared with the conventional ultraviolet radiation method. Thus, according to the evaluating experiment 1, it can be understood that the unevenness caused by the film loss as described in the embodiments can be reduced by using the method according to the foregoing embodiment.

Evaluating Experiment 2

As an evaluating experiment 2, three types of organic materials (C1, C2, C3) containing different compounds were applied to different wafers W to form thereon organic films. The organic material C1 was a thermal crosslinking type as described in the first embodiment, and the organic materials C2 and C3 were an acidic crosslinking type as described in the second embodiment. As described in the respective embodiments, $N_2$ gas was supplied into the processing space 40 and the wafers W having the organic films formed thereon were heated in an atmosphere having a low oxygen concentration (hereinafter referred to as low oxygen atmosphere), so that the surface parts of the organic films were sublimated and removed. Thereafter, thicknesses of the organic films were measured and film loss amounts (%) relative to the film thicknesses of the organic films before the heating process were calculated.

Figure 14:
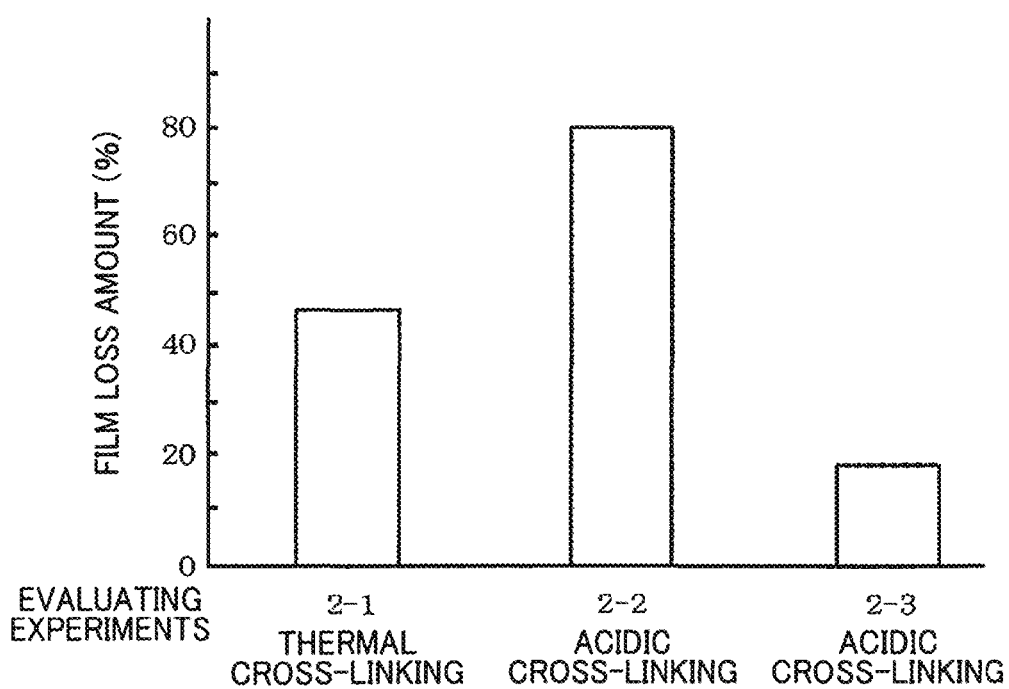
FIG. 14 is a graph showing the result of an evaluating experiment.

The graph of FIG. 14 shows the result of the evaluating experiment 2. The axis of ordinate in the graph represents the film loss amount. The film loss amounts were 47%, 81% and 19% in the evaluating experiments 2-1, 2-2 and 2-3, respectively. Namely, it was confirmed that the film loss could occur in either the organic film of thermal crosslinking type or the organic film of acidic crosslinking type.

Evaluating Experiment 3

As an evaluating experiment 3, the organic material of acidic crosslinking type described in the second embodiment was applied to wafers W to form thereon organic films, and the respective wafers were heated in the heating module 3 under different conditions. A heat-resistant temperature of the organic material, i.e., a lower limit value at which the organic material decomposes was 500° C. or below. As an evaluating experiment 3-1, the wafer was heated at 450° C. in the air atmosphere. As an evaluating experiment 3-2, the wafer was heated at 450° C. in the low oxygen atmosphere. As an evaluating experiment 3-3, the wafer was heated at 600° C. in the air atmosphere. As an evaluating experiment 3-4, the wafer was heated at 600° C. in the low oxygen atmosphere. Namely, in the evaluating experiments 3-1 and 3-2, the wafers were heated at the temperature at which the film loss by sublimation did not tend to occur, while in the evaluating experiments 3-3 and 3-4, the wafers were heated at the temperature at which the film loss by sublimation was likely to occur. Each heating time was 60 seconds. The heated wafers W were loaded in a dry etching apparatus to etch the organic films by using CF4 (carbon tetrafluoride), and etching rates (unit: nm/minute) were measured.

Figure 15:
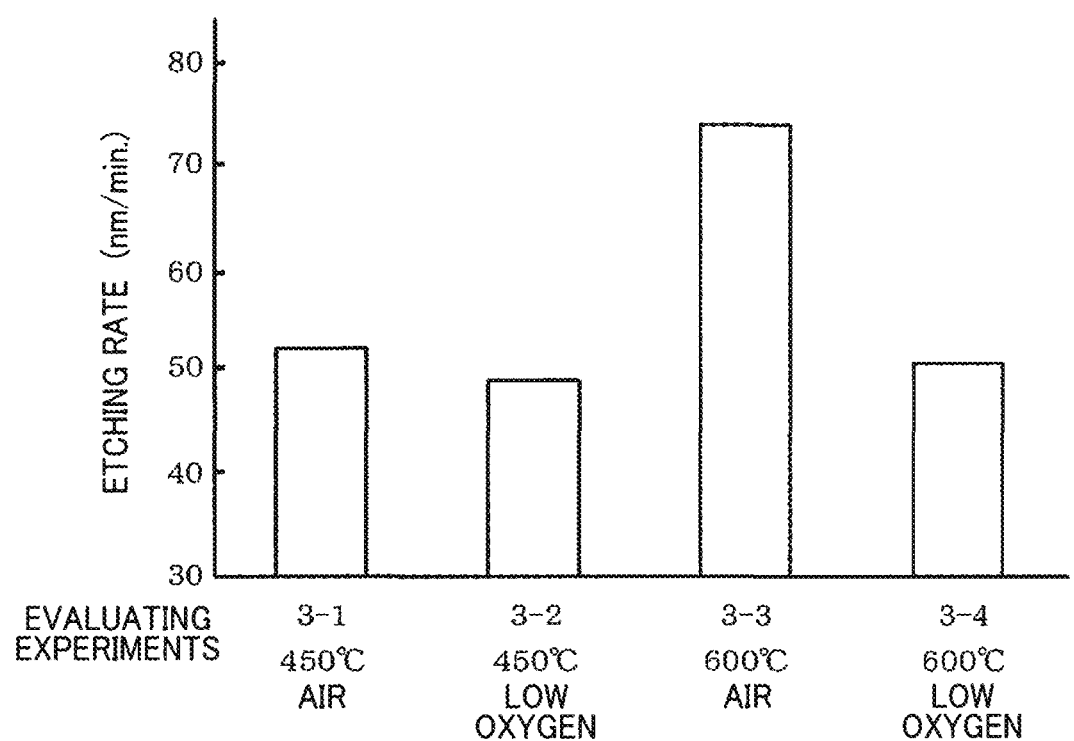
FIG. 15 is a graph showing the result of an evaluating experiment.

The graph of FIG. 15 shows the result of the evaluating experiment 3. The axis of ordinate in the graph represents the aforementioned etching rate. The etching rates were 52 nm/min, 49 nm/min, 74 nm/min and 51 nm/min in the evaluating experiments 3-1, 3-2, 3-3 and 3-4, respectively. As described above, since the organic film is used as a mask of the lower layer film 61, a lower etching rate is preferred. The etching rate of the organic film of the evaluating experiment 3-3 was greater than the etching rates of the organic films of the evaluating experiments 3-1, 3-2 and 3-4. The reason is considered as follows. Since the heating temperature of the evaluating experiment 3-3 was higher than that of the evaluating experiment 3-1, the reaction between the organic film and oxygen in the atmosphere advanced more, which made larger the etching rate. When the result of the evaluating experiment 3-3 and the result of the evaluating experiment 3-4 are compared with each other, it can be understood that the oxidation can be restrained by the heating process in the low oxygen atmosphere. Thus, the effect of the second embodiment could be confirmed from the result of the evaluating experiment 3.

What is claimed is:

1. A substrate processing method comprising:
    a coating step that applies a coating liquid to a substrate having a front surface on which a pattern is formed, thereby forming a coating film on the substrate;
    a film removing step that heats the substrate to gasify components of the coating film thereby to reduce a thickness of the film; and
    a film curing step that is performed after or simultaneously with the film removing step and that heats the substrate to cure the coating film through crosslinking reaction,
    wherein the film removing step is performed under conditions ensuring that an average thickness of the cured coating film is not greater than 80% of an average thickness of the coating film before being subjected to the film removing step.

2. The substrate processing method according to claim 1, wherein the film removing step heats the substrate in an atmosphere having an oxygen concentration of 100 ppm or below.

3. The substrate processing method according to claim 1, further comprising an additional coating step that is performed after the film removing step and the film curing, step.

4. The substrate processing method according to claim 1, wherein:
    the crosslinking reaction occurs via oxygen existing around the coating film;
    the film curing step is performed after the film removing step;
    the film removing step heats the substrate under a first oxygen concentration at which the crosslinking reaction does not occur; and
    the film curing step heats the substrate under a second oxygen concentration such that the crosslinking reaction occurs, and the second oxygen concentration is higher than the first second oxygen concentration.

5. The substrate processing method according to claim 1 wherein:
    the crosslinking reaction occurs via oxygen existing around the coating film;
    the film curing step is performed after the film removing step;
    the film removing step heats the substrate at a temperature higher than a temperature at which the film curing step heats the substrate.

6. A non-transitory storage medium storing computer program to be used in a computer for controlling a substrate processing apparatus, wherein the computer program has steps for executing the substrate processing method according to claim 1.

* * * * *